United States Patent [19]
Coley et al.

[11] 3,955,709
[45] May 11, 1976

[54] OUTDOOR ELECTRICAL ENCLOSURE

[75] Inventors: Kenneth R. Coley, Fairfield; George M. Carris, Monore, both of Conn.

[73] Assignee: Westinghouse Electric Corporation, Pittsburgh, Pa.

[22] Filed: Sept. 18, 1974

[21] Appl. No.: 507,164

[52] U.S. Cl. .............................. 220/335; 220/334; 220/3.8; 220/18
[51] Int. Cl.² ........................................ B65D 43/24
[58] Field of Search ............ 220/3.8, 334, 335, 336, 220/337, 338, 340, 18; 174/50, 66

[56] References Cited
UNITED STATES PATENTS

| | | | |
|---|---|---|---|
| 1,715,538 | 6/1929 | Dean | 220/3.8 |
| 2,250,977 | 7/1941 | Walker | 220/3.8 |
| 2,277,618 | 3/1942 | Utter | 220/3.8 |
| 2,330,975 | 10/1943 | Jackson | 220/3.8 |
| 2,656,948 | 10/1953 | McGee | 220/3.8 |
| 2,897,993 | 8/1959 | Uecker | 220/335 |
| 3,113,694 | 12/1963 | Sulzer | 220/3.8 |
| 3,140,344 | 7/1964 | Slater | 220/335 |
| 3,794,205 | 2/1974 | Cantrell | 220/335 |

*Primary Examiner*—Ro E. Hart
*Attorney, Agent, or Firm*—L. P. Johns

[57] ABSTRACT

A rain-tight outdoor enclosure for containing electrical apparatus characterized by a box-like container and a detachable cover hingedly mounted. The container comprising an open vertical side and a open bottom end. The cover comprising a wall coextensive with the open side and having opposite flanges overlapping portions of corresponding sidewalls of the container. Means for hingedly mounting the cover on the container for movement between open and closed positions and including a groove in each opposite container side wall and a protrusion in each opposite flange of the cover which protrusions extend into the grooves and are slidable therein between open and closed positions of the cover. Latching means for holding the cover in the open position and comprising a projection on at least one of the side walls and abuttable with the cover when the cover is opened and each protrusion is in the open position in its groove.

5 Claims, 6 Drawing Figures

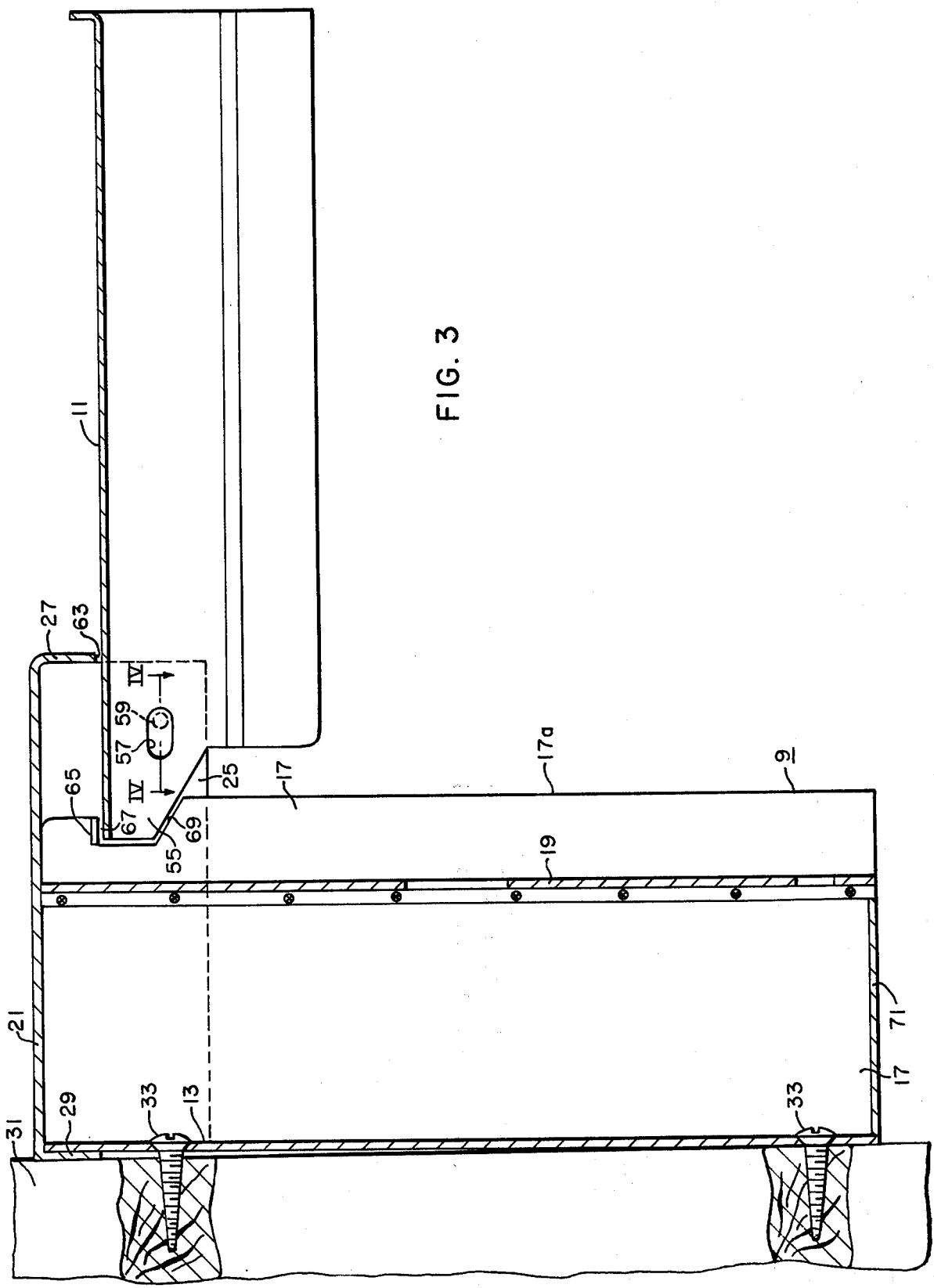

OUTDOOR ELECTRICAL ENCLOSURE

BACKGROUND OF THE INVENTION

1. Field of the Invention

This invention relates to an outdoor enclosure for containing electrical apparatus, and more particularly pertains to an outdoor rain-tight enclosure.

2. Description of the Prior Art

Outdoor enclosures for electrical accessories have been known in the art. Various problems have been associated with them including raintightness and accessability to the interior thereof.

SUMMARY OF THE INVENTION

It has been found in accordance with this invention that an improved outdoor enclosure may be provided which comprises a box-like container and a detachable cover hingedly mounted, the container comprising a bottom wall, an upper end wall and a pair of opposite side walls forming an open side for access to the interior of the container, the cover comprising a top wall coextensive with the open side and having side flanges substantially aligned with the corresponding opposite side walls, the side walls having shoulders abuttable with the edges of a corresponding side wall and having surface portions overlapping portions of corresponding side walls, means for hingedly mounting the cover on the container for movement between open and closed positions and comprising interfitting members including a groove in each flange and a protrusion on the cover of each opposite flange, the protrusions being slidable in the grooves between open and closed positions of the cover, and means for latching the cover in the open position and comprising a projection on at least one of the side walls and abuttable with the cover when the cover is opened and the protrusions are in the open positions in the grooves.

The advantage of the device of this invention is that it provides for mounting and hinging a rain-tight cover on a box by employment of a pair of oppositely disposed bumps or projections in the box side walls which extend into corresponding slots in the cover so that the cover may be snapped into the box. Moreover, the device has the advantage of using an offset in the cover which extends into the box and thereby enables the use of a cover of any depth without the use of any draw dies in tooling and enables a simpler end wall construction without any forming to allow for a cover that is wider than the box.

BRIEF DESCRIPTION OF THE DRAWINGS

FIG. 3 is a vertical sectional view similar to that of FIG. 2, but showing the cover in the open position;

DESCRIPTION OF THE PREFERRED EMBODIMENTS

Figure 1:
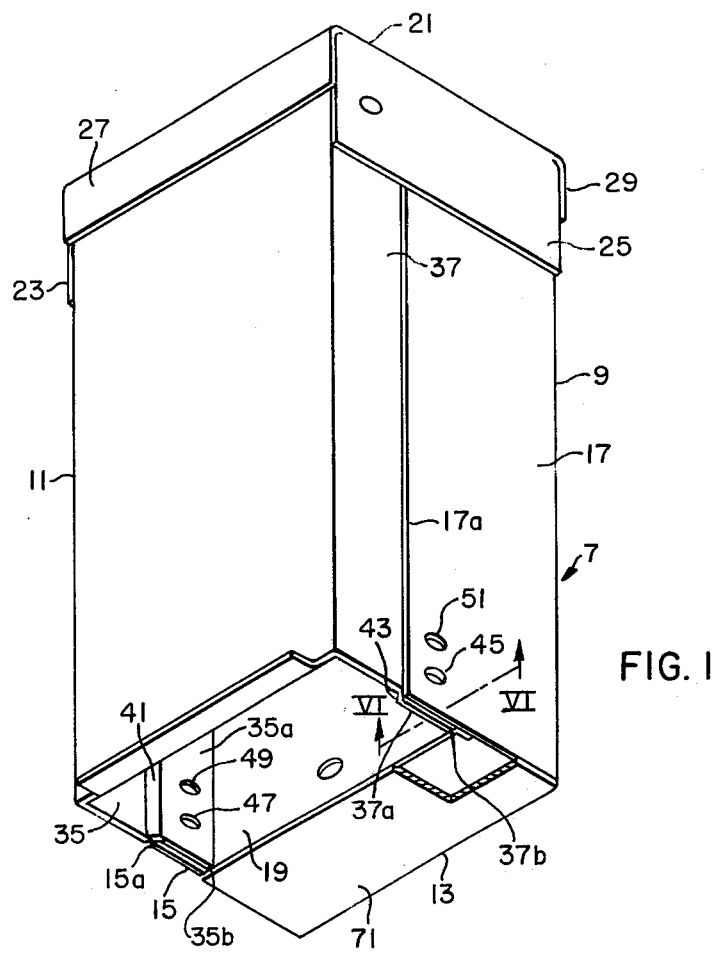
FIG. 1 is an isometric view of an outdoor enclosure in accordance with this invention.

In FIG. 1 an outdoor enclosure is generally indicated at 7 and it comprises a container or a box 9 and a cover 11. The container 9 comprises a back wall 13 and a pair of opposite side walls 15 and 17 which together with the back wall form a compartment having an open front and an open lower end. A shield or partition 19 is provided to separate the compartment into two portions as well as to prevent the cover 11 from being closed beyond its intended position in the manner set forth hereinbelow.

The upper end of the container 9 is closed by an end or top wall 21 which includes opposite side flanges 23 and 25 as well as front and rear flanges 27 and 29. The top wall 21 is secured to the container 9 in a suitable manner such as by spot welds (not shown) between the side flanges 23, 25, and the side walls 15, 17. The top wall closes the upper end of the compartment formed by the container 9 in a rainproof manner.

Figure 2:
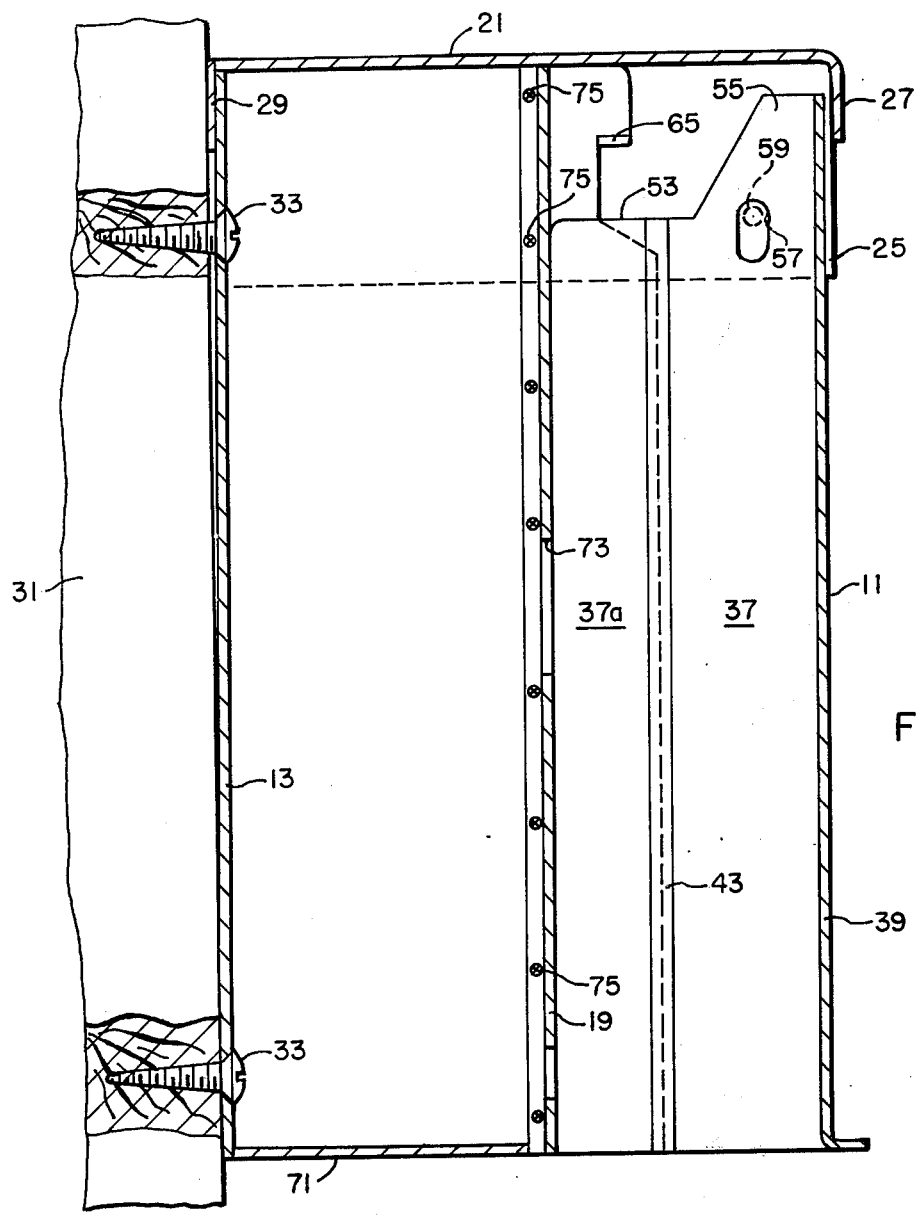
FIG. 2 is a vertical sectional view through the enclosure of FIG. 1.

As shown in FIG. 2 the enclosure 7 is mounted on an upright surface such as a wall 31 in a suitable manner such as mounting screws 33.

Figure 6:
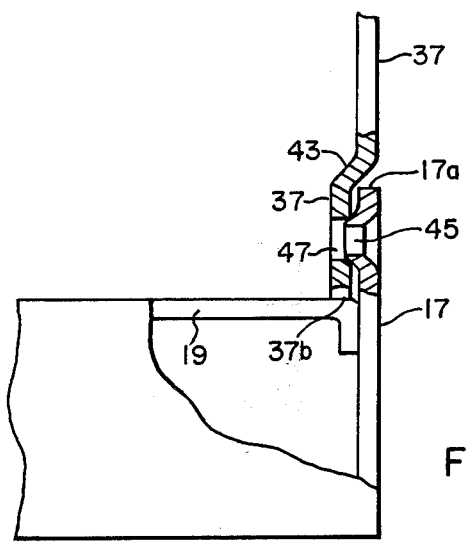
FIG. 6 is a fragmentary enlarged end view taken on area A of FIG. 1.

The cover 11 is a channel-shaped member having opposite side flanges 35, 37. Each side wall flange 35, 37 includes a longitudinal portion adjacent the front wall 39 as well as a second longitudinal portion 35a, 37a remote from said front wall. As shown in FIG. 1 the portions 35a, 37a are demarked from the portions 35, 37 by an inturned shoulder 41, 43, which shoulders are in substantial abutment with the edges 15a and 17a of the side walls 15, 17 (FIG. 6), when the cover is closed. As shown in FIG. 6 in the closed position of the cover, the side flange 35, 37 are flush with the corresponding side walls 15, 17. At the same time the portions 35a, 37a are internal of said side walls and the inner edges 35b and 37b are preferably in abutment with the shield or partition 19. To maintain the cover in the closed position the portions 35a and 37a include similar interfitting means, such as inturned projections 45 in side walls 15, 17 and projection receiving holes 47 in the portions 35a and 37a.

In addition, the portions 35a and side wall 15 as well as the portion 37a and the side wall 17 may include aligned holes 49 and 51 through which pad locks may be inserted.

In the alternative the portions 35a, 37a may be exterior of the side walls 15, 17 without interferring with the operational character of the enclosure 7.

As shown in FIG. 2 the upper end of the cover 11 terminates at 53 at a spaced distance from the top wall 21. However, an extension 55 of the side flange 37 is provided to facilitate the latching of the cover 11 in the open position as shown in FIG. 3.

Figure 4:
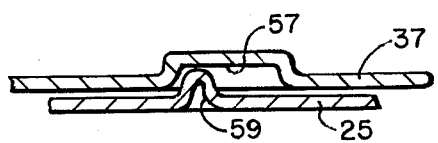
FIG. 4 is a horizontal sectional view taken along line IV—IV of FIG. 3.
Figure 5:
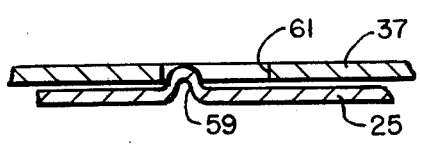
FIG. 5 is a horizontal sectional view of another embodiment of the construction shown in FIG. 4.

In addition, mounting means are provided between the cover 11 and side flanges 23, 25. More particularly, mounting means comprise a groove 57 and interfitting dimple 59 (FIG. 4) which are formed in the sheet metal forming the container 9 and cover 11 by the metal forming process of cupping or similar forming method. Another embodiment of the groove 57 may comprise a slot 61 (FIG. 5) in which a dimple or protrusion 59 is slidably disposed. Similar interfitting grooves 57 and dimples 59 are provided on opposite sides of the cover 11 and flanges 23, 25 whereby the cover is hingedly mounted in place.

In the closed position of the cover (FIG. 2) the dimple 59 is disposed at the upper end of the groove 57. When the cover 11 is opened (FIG. 3), it is raised to a horizontal position so that it makes contact at 63 with the front flange 27, whereupon the cover is moved to the left until the dimple 59 is disposed at the opposite end of the groove 57. To maintain the cover in the position, an inturn projection such as a flange 65 or other suitable means such as a limit pin is provided preferably on opposite sides of the cover 11 in the side wall 15 and 17. With the extension 55 in contact at 57 with the projection 65 the cover 11 is maintained in the open position. For the projection 65 is a flange a portion of the side wall 17 may be notched at 69 and the flange 65 may thereby include the portion of the notched out sheet metal forming the container 9.

Manifestly, to lower the cover 11 to the closed position of FIG. 2 the cover is simply pulled to the right (FIG. 3) until extension 55 is no longer in contact with the projection 65 whereupon the cover is rotated clockwise about the dimple 59 until it is closed.

As was set forth above the shield or partition 19 is provided to divide the compartment of the container 9 into two portions including the portions between the partition and the back wall 13. In that portion lead wires may extend into the enclosure either from above through the top wall 21 or from the bottom. Where the lead wires extend through the suitable opening in the top, the lower end of the compartment may be closed by an end wall 71. The end portions of the lead wires are connected to circuit breakers the handles of which extend through a suitable opening 73 in the partition. The partition is retained in place in a suitable manner such as by spot welds 75 between the partition and side walls 15, 17.

Accordingly, the outdoor enclosure of the present invention provides a rain-tight box having the advantages of eliminating separate hinging means, facilitated insulation of the cover to the box and end wall in assembly, snap-in assembly of the cover, and mounting and hinging means as an integral part of the container assembly. The enclosure also provides for flush fittings between the cover and walls without sacrificing the raintight capabilities, enables the use of any depth cover or box without use of draw dies in tooling, and allows for a simpler top end wall construction without any forming in the end wall to allow for the cover wider than the box.

What is claimed is:

1. An outdoor enclosure for containing electrical apparatus, comprising a box-like container and a detachable cover hingedly mounted; the container comprising a bottom wall, an upper end wall, and a pair of opposite sidewalls forming an open side for access to the interior of the container; the cover comprising a front wall coextensive with the open side and having opposite side flanges, each side flange including an inturned shoulder dividing each flange into two longitudinal portions, one longitudinal portion being adjacent to the cover front wall and the second longitudinal portion being remote from said front wall, the shoulders abutting the edges of the corresponding side walls, a partition extending across the interior of the container, the inner edges of the second longitudinal portions contacting the partition when the cover is closed; means for hingedly mounting the cover on the container for movement between open and closed positions and comprising interfitting members including a groove and a protrusion on the opposite side walls, one of the groove and protrusion being on the cover and the other of the groove and protrusion being on opposite sides of the container, and the protrusions being slidable in the grooves between open and closed positions of the cover for latching the cover in the open position and comprising a projection on at least one of the side walls and abuttable with the cover when the cover is open and the protrusions are in the open positions in the grooves.

2. The outdoor enclosure of claim 1 in which the cover comprises side flanges substantially aligned with the corresponding opposite side walls.

3. The outdoor enclosure of claim 2 in which the upper edge of each side wall comprises a notch, and each side flange comprises an extension insertable into a corresponding notch when the cover is in the open position.

4. The outdoor enclosure of claim 1 in which the end wall comprises edge flanges overlying opposite side walls and extending beyond said edges of the side walls and remote from the bottom wall, and one of the interfitting members of the hinge means being located on the edge flanges.

5. The outdoor enclosure of claim 1 in which the lower end of the container opposite the upper end wall is open.

* * * * *